(12) United States Patent
Rho

(10) Patent No.: US 8,168,491 B2
(45) Date of Patent: May 1, 2012

(54) METHOD FOR FABRICATING DUAL POLY GATE IN SEMICONDUCTOR DEVICE

(75) Inventor: Il Cheol Rho, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 354 days.

(21) Appl. No.: 12/648,785

(22) Filed: Dec. 29, 2009

(65) Prior Publication Data

US 2010/0285659 A1 Nov. 11, 2010

(30) Foreign Application Priority Data

May 6, 2009 (KR) .................. 10-2009-0039454

(51) Int. Cl.
*H01L 21/8238* (2006.01)
(52) U.S. Cl. .................. 438/199; 257/E21.637
(58) Field of Classification Search .................. 438/199; 257/E21.632, E21.635, E21.637
See application file for complete search history.

(56) References Cited

U.S. PATENT DOCUMENTS

| 7,582,924 | B2 | 9/2009 | Lee et al. | |
| 2002/0090817 | A1 | 7/2002 | Wang | |
| 2009/0065779 | A1* | 3/2009 | Kusumoto | 257/66 |

FOREIGN PATENT DOCUMENTS

| KR | 10-2008-0062728 | 7/2008 |
| KR | 10-2008-0062733 | 7/2008 |
| KR | 10-0914284 | 7/2008 |
| KR | 10-2008-0085533 | 9/2008 |

* cited by examiner

*Primary Examiner* — Quoc Hoang
(74) *Attorney, Agent, or Firm* — Marshall, Gerstein & Borun LLP

(57) ABSTRACT

A method for fabricating a dual poly gate in a semiconductor device, comprising: forming a gate insulation layer and a polysilicon layer on a semiconductor substrate that defines a first region and a second region; implanting first and second conductive type impurity ions into the first region and the second region of the polysilicon layer, respectively; forming first and second conductive type polysilicon layer in the first and second regions, respectively, by annealing the semiconductor substrate; forming a barrier metal layer on the first and second conductive type polysilicon layers; forming an oxide layer that lowers resistance of a metal by an oxidation process; forming a metal layer and a hard mask layer on the oxide layer; and forming a first conductive type poly gate on the first region and a second conductive type poly gate on the second region by a patterning process.

13 Claims, 7 Drawing Sheets

FIG.9

| | Rs | | Atomic force microscope (AFM) | | | Full-width -half-maximum (FWHM) | |
|---|---|---|---|---|---|---|---|
| | Rs | Rs Unif. | P-v(nm) | Pm s(nm) | | Plane index (1 1 0) | Plane index (2 0 0) |
| WSIN_W As Dep | 3.74 | 1.82 | 5.68 | 0.69 | | 0.66 | 0.86 |
| WSIN_W 24Hrs Delay | 3.42 | 1.76 | 8.30 | 0.82 | | 0.62 | 0.83 |
| WSIN_W 48Hrs Delay | 3.46 | 1.64 | 7.22 | 0.85 | | 0.63 | 0.80 |

FIG.10

| Under layer | Thickness (Meta-pulse) | Thickness (XRF) | Rs (Sheet resistance) | Specific resistance |
|---|---|---|---|---|
| Oxide Thin film | 494 Å | 522 Å | 2.55 Ω/□ | 13.31 μΩ-cm |
| PVD Ti 30 Å | 508 Å | 531 Å | 6.3 Ω/□ | 33.45 μΩ-cm |
| PVD TiN 420 Å | 509 Å | 519 Å | 6.62 Ω/□ | 34.35 μΩ-cm |
| CVD TiN 250 Å | 512 Å | 529 Å | 5.57 Ω/□ | 29.46 μΩ-cm |

METHOD FOR FABRICATING DUAL POLY GATE IN SEMICONDUCTOR DEVICE

CROSS-REFERENCE TO RELATED APPLICATION

Priority to Korean patent application number 10-2009-0039454 filed May 6, 2009, the entire disclosure of which is incorporated by reference in its entirety, is claimed.

BACKGROUND OF THE INVENTION

The invention relates generally to fabrication of a semiconductor device and, more particularly, to a method for fabricating a dual poly gate in a semiconductor device.

A semiconductor device, e.g. a dynamic random access memory (DRAM) device, has a cell region and a peripheral region, and in particular the peripheral region is formed of a complementary metal oxide semiconductor (CMOS). In a general CMOS, a device is formed in a surface structure channel structure in an n-type metal oxide semiconductor (NMOS) region and formed in a buried channel structure in a p-type metal oxide semiconductor (PMOS) region to reduce power consumption of the device and obtain high operation speed. In a buried channel structure, channel length is reduced as the degree of integration of the device is increased and accordingly, there is a problem that a high electric field is applied, which deteriorates leakage current properties. Therefore, a dual poly gate structure is employed to fabricate a p-type MOS transistor having the surface channel structure. In the dual poly gate structure, a p-type poly gate implanted with p-type impurities is placed in a region in which a p-type MOS transistor is formed and an n-type poly gate implanted with n-type impurities is placed in a region in which an n-type MOS transistor is formed.

However, during implementation of a subsequent thermal process for forming a semiconductor device after forming a dual poly gate, there occurs a phenomenon wherein a tungsten silicide ($WSi_x$) layer used as a diffusion barrier layer coheres to the structure. In this structure, boron ions doped into an n-type poly gate are diffused out in a direction of a metal layer through a grain boundary of the cohered tungsten silicide layer, resulting in a PMOS defect. Various methods for correcting this phenomenon have been developed, but there occurs a problem that specific resistance of the metal layer used for signal transfer varies with the condition of an underlying layer. Since the variation in the specific resistance of the metal layer by a condition of an underlying layer can influence the overall properties of the semiconductor device, there is required an underlying layer capable of stably maintaining the specific resistance of the metal layer.

SUMMARY OF THE INVENTION

In one embodiment, a method for fabricating a dual poly gate in a semiconductor device comprises: forming a gate insulation layer and a polysilicon layer on a semiconductor substrate that defines a first region and a second region; implanting first and second conductive type impurity ions into the first and second region of the polysilicon layer, respectively; forming first and second conductive type polysilicon layers in the first and second regions, respectively, by annealing the semiconductor substrate; forming a barrier metal layer on the first and second conductive type polysilicon layers; forming an oxide layer that lowers resistance of a metal by an oxidation process; forming a metal layer and a hard mask layer on the oxide layer; and forming a first conductive type poly gate on the first region and a second conductive type poly gate on the second region by a patterning process.

Preferably, the first conductive type impurity is a p-type impurity ion comprising boron (B) ion and the second conductive type impurity is an n-type impurity ion comprising phosphorus (P) ion.

Preferably, the barrier metal layer comprises a structure wherein at least one of a titanium (Ti) layer, a tungsten nitride ($WN_x$) layer, and a tungsten silicon nitride (WSiN) layer is stacked.

In one preferred embodiment, the oxidation process comprises exposing the semiconductor substrate formed with the barrier metal layer to air at normal (i.e., atmospheric) pressure and ambient temperature for 24 hours to 48 hours to form the oxide layer.

In an alternative preferred embodiment, the oxidation process comprises placing the semiconductor substrate formed with the barrier metal layer within a reactor under an oxygen ($O_2$) atmosphere, and implementing a thermal process that heats the interior of the reactor for 20 seconds to one minute at 400 degrees Celsius to 1000 degrees Celsius.

In another alternative preferred embodiment, the oxidation process comprises placing the semiconductor substrate formed with the barrier metal layer within a plasma chamber, and applying radio frequency power at 500 W to 10000 W for one second to 30 seconds while injecting an oxygen gas at a flow rate of 50 sccm to 1000 sccm and a mixture gas including nitrogen ($N_2$) gas or argon (Ar) gas into the plasma chamber and maintaining a pressure in the plasma chamber at 1 mTorr to 10 Torr.

Preferably, the metal layer comprises a tungsten (W) layer deposited by physical vapor deposition.

BRIEF DESCRIPTION OF THE DRAWINGS

FIG. 9 is a table showing a resistance and a grain size according to a delay time until before deposition of a tungsten layer after deposition of a WSiN layer.

FIG. 10 is a table showing variation in a resistance of a tungsten layer according to a material of an underlying layer.

DESCRIPTION OF SPECIFIC EMBODIMENTS

Hereinafter, preferred embodiments of the invention will be described in detail with reference to the accompanying drawings.

FIGS. 1 through 7 illustrate process steps for fabricating a dual poly gate in a semiconductor device in accordance with an embodiment of the invention. FIG. 8 is a graph illustrating gate sheet resistance according to a delay time until before deposition of a tungsten layer after deposition of a WSiN layer. FIG. 9 is a table showing resistance and grain size according to delay time until before deposition of a tungsten layer after deposition of a WSiN layer. FIG. 10 is a table showing variation in resistance of a tungsten layer according to a material of an underlying layer.

Figure 1:
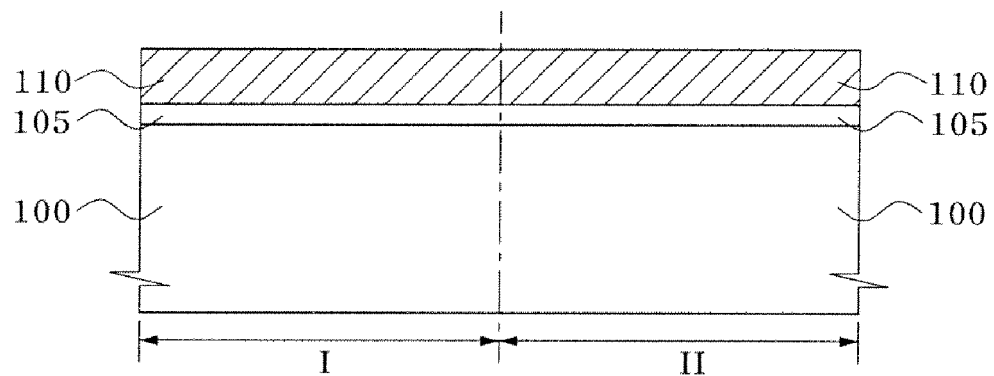
FIGS. 1 through 7 illustrate process steps for fabricating a dual poly gate in a semiconductor device in accordance with an embodiment of the invention.

Referring to FIG. 1, a gate insulation layer 105 and a conductive layer 110 are formed on a semiconductor substrate 100 that defines a first region (I) and a second region (II). Herein, the first region (I) is a region in which a p-type MOS transistor is to be placed and the second region (II) is a region in which an n-type MOS transistor is to be placed. The gate insulation layer 105 preferably comprises an oxide layer formed using thermal oxidation. The conductive layer 110 formed on the gate insulation layer 105 preferably comprises a polysilicon layer. This conductive layer 110 may or may not be doped with impurities. When doped with impurities, the conductive layer 110 is implanted with n-type impurities, e.g. phosphorus (P) ions.

Figure 2:
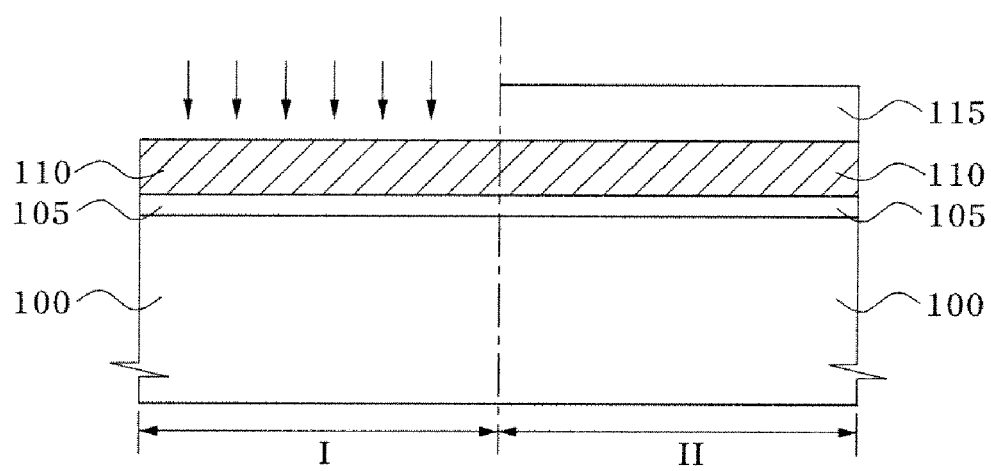

Referring to FIG. 2, a mask pattern 115 that exposes the first region (I) of the semiconductor substrate 100 is formed. The mask pattern 115 preferably comprises a photoresist layer. To this end, a photoresist layer is first formed on the semiconductor substrate 100. Next, a lithography process including exposure and development steps is implemented to form the mask pattern 115, which exposes a portion of the conductive layer 110 corresponding to the first region (I) in the semiconductor substrate 100 but covers the remaining portion in the substrate that includes the second region (II). Next, an ion implantation process is used to implant impurity ion into the exposed portion of the conductive layer 110 corresponding to the first region (I) using the mask pattern 115 as an ion implantation barrier layer. Specifically, as indicated by arrows in the FIG. 2, an ion implantation process is implemented using the mask pattern as an ion implantation barrier layer to implant p-type impurity ions, e.g. boron (B) ions, into the portion of the conductive layer 110 corresponding to the first region (I).

Figure 3:
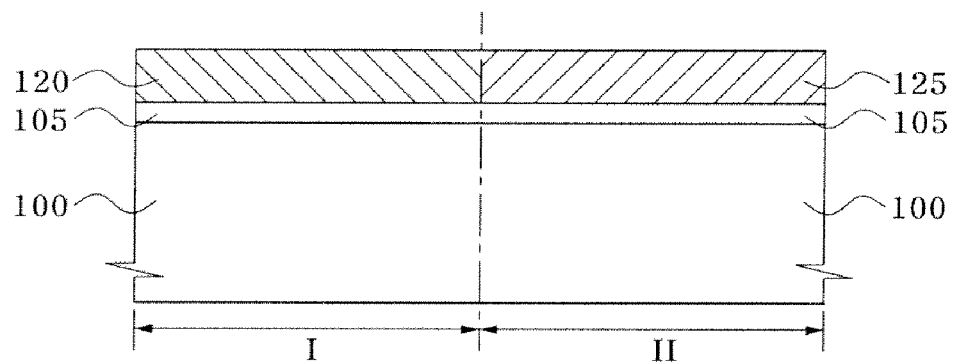

Referring to FIG. 3, the mask pattern 115 that covers the second region (II) in the semiconductor substrate having been subject to the ion implementation process (see FIG. 2) is removed. The mask pattern 115 preferably is removed using a strip process. Next, an annealing process is implemented on the semiconductor substrate 100 to activate the p-type impurity ions implanted into the portion of the conductive layer 110 (see FIG. 2) corresponding to the first region (I). With the activation of the impurity ions implanted into the conductive layer 110 by this annealing process, a first conductive type polysilicon layer 120 is formed in the first region (I) and a second conductive type polysilicon layer 125 is formed in the second region (II). Herein, the first conductive type is a p-type conductive type and the second conductive type is an n-type conductive type.

Figure 4:
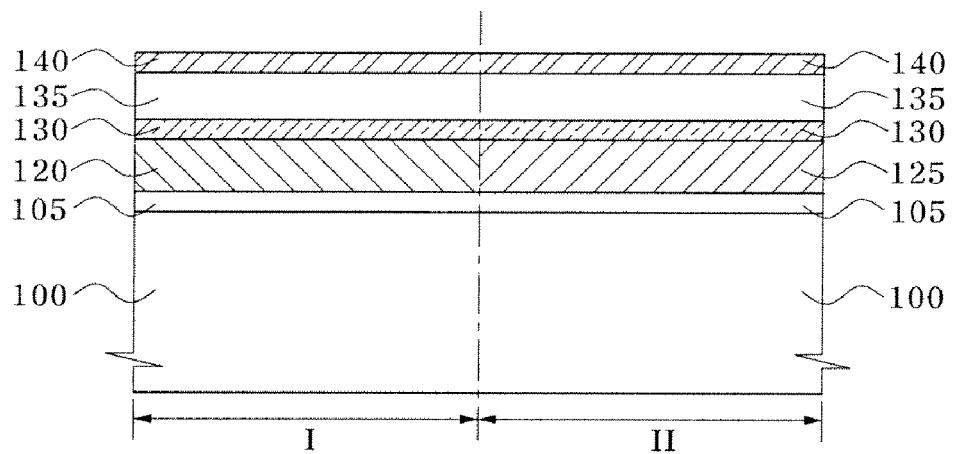

Referring to FIG. 4, a first barrier metal layer 130, a second barrier metal layer 135, and a third barrier metal layer 140 are sequentially deposited on the first conductive type polysilicon layer 120 and the second conductive type polysilicon layer 125 of the semiconductor substrate 100. Upon formation of a metal gate, a tungsten silicide (WSi$_x$) layer has been generally used as a barrier metal layer. However, there is a problem wherein the tungsten silicide layer coheres in a thermal process implemented in a semiconductor device fabrication process after forming the metal gate. Also, there is a problem wherein boron ions doped into an n-type poly gate diffuse out in a direction of a metal layer through a grain boundary of the tungsten silicide layer, resulting in a PMOS defect. Accordingly, a multi-layered barrier metal structure is deposited to restrict cohesion of the tungsten silicide layer and diffusion of the impurities and a tungsten silicon nitride layer is deposited to restrict the out-diffusion of the boron ions.

The first barrier metal layer 130 functions to reduce interfacial resistance between the first conductive polysilicon layer 120 and the second conductive polysilicon layer 125, and a metal layer to be formed later. This first barrier metal layer 130 preferably comprises a titanium (Ti) layer. Next, the second barrier metal layer 135 deposited on the first metal barrier layer 130 functions as a barrier that prevents diffusion of the conductive type materials of the first conductive polysilicon layer 120 and the second polysilicon layer 125 in the subsequent thermal process. Also, the second barrier metal layer 135 prevents oxidation of the first barrier metal layer 130. This second barrier metal layer 135 preferably comprises a tungsten nitride (WN$_x$) layer. Also, the third barrier metal layer 140 deposited on the second barrier metal layer 135 functions to restrict diffusion of the first conductive type, e.g. boron (B) ion in the thermal process implemented later upon the fabrication of a semiconductor device. This third barrier metal layer 140 preferably comprises a tungsten silicon nitride (WSiN) layer.

Meanwhile, a metal layer that transfers a signal should have low electrical resistance. In this respect, if a metal layer is deposited directly on the third barrier metal layer 140, when the metal layer is formed of a tungsten layer, the specific resistance is about twice as large as that when the tungsten layer is deposited on an oxide layer. Specifically, referring to FIG. 10, a table illustrating variation in a resistance of a tungsten layer according to a material of an underlying layer, placement of a titanium (Ti) layer or a titanium nitride (TiN) layer under the tungsten layer shows a sheet resistance Rs of 6.3Ω/Y and a specific resistance of 33.45 μΩ-cm. In contrast, placement of an oxide layer under the tungsten layer shows the sheet resistance Rs of 2.55Ω/Y and a specific resistance of 13.31 μΩ-cm, which are small resistance values. Accordingly, the invention suggests a method of forming an oxide layer on the third barrier metal layer 140 so that the resistance of the metal layer has a relatively small value. Herein, values not described in the table are thicknesses of the oxide layer, the Ti layer, and the TiN layer measured using various types of equipment (Meta pulse and XRF).

Figure 5:
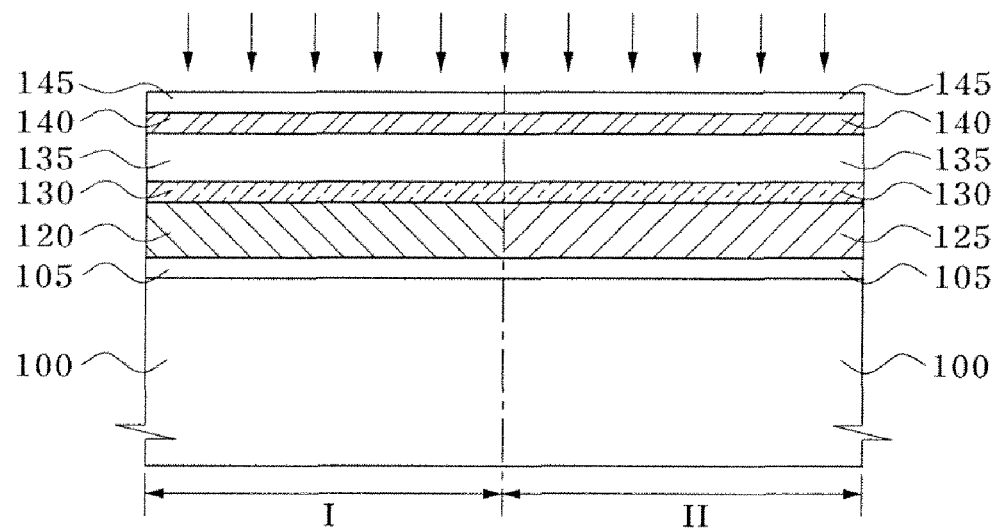

To this end, as illustrated in FIG. 5, an oxidation process is implemented to form an oxide layer 145 on a surface of the third barrier metal layer 140. The oxidation process for forming the oxide layer 145 on the surface of the third barrier metal layer 140 preferably is one selected from three preferred methods. In a first preferred method for forming the oxide layer 145, the semiconductor substrate is exposed to air to form the oxide layer on the surface of the third barrier metal layer 140. To this end, the semiconductor substrate 100 formed with the third barrier metal layer 140 preferably is stored for a long time, e.g. 24 hours or more, preferably 24 hours to 48 hours, exposed to the air at normal temperature and pressure (i.e., ambient temperature and atmospheric pressure). Thus, a native oxide layer is formed on the third barrier metal layer 140 by an aging effect.

Referring to FIG. 8, a graph of experimental data illustrating a gate sheet resistance according to a delay time until before deposition of the metal layer, i.e. a tungsten layer after deposition of the third barrier metal layer 140, e.g. a tungsten silicon nitride (WSiN) layer, it is shown that the gate sheet resistance tends to be reduced as the delay time is increased until before the deposition of the metal layer. Also, referring to FIG. 9, a table showing a resistance according to a delay time until before deposition of a tungsten layer after deposition of a WSiN layer, it is shown that the sheet resistance Rs is 3.74 when the tungsten layer is deposited directly on the WSiN layer but the sheet resistance Rs is lowered to 3.42 after a delay time of 24 hours has elapsed. Accordingly, the semiconductor substrate 100 is stored for 24 hours or more with exposed to the air until the oxide layer with a sufficient thickness 145 is formed on the third barrier metal layer 140 and a subsequent process is then implemented, thereby reducing the resistance of the metal layer.

In a second preferred method for forming the oxide layer 145 on the surface of the third barrier metal layer 140, a thermal process is implemented on the third barrier metal layer 140 to produce the oxide layer 145. To this end, the semiconductor substrate 100 formed with the third barrier metal layer 140 is placed within a reactor (not shown) under an oxygen ($O_2$) atmosphere. Next, a rapid thermal process that heats the interior of the reactor at a high temperature, e.g. a temperature between 400 degrees Celsius and 1000 degrees Celsius, for 20 seconds to one minute is implemented. Then, an oxidation source is supplied onto the surface of the third barrier metal layer 140 and oxidized to form the oxide layer 145. An aging effect is increased by increasing the temperature in the reactor of the oxygen atmosphere with this thermal process, thereby capable of reducing the aging time; otherwise 24 hours or more may be taken.

In a third preferred method for forming the oxide layer 145, plasma is generated under an oxygen ($O_2$) atmosphere to form the oxide layer 145. To this end, the semiconductor substrate 100 formed with the third barrier metal layer 140 is placed with a plasma chamber (not shown) of an oxygen ($O_2$) atmosphere. Next, into the plasma chamber, an oxygen gas is injected, preferably at a flow rate of 50 sccm to 1000 sccm along with a mixture gas comprising nitrogen ($N_2$) gas or argon (Ar) gas, for example. At the same time, pressure in the plasma chamber is maintained, preferably at 1 mTorr to 10 Torr, and radio frequency power is applied, preferably at 500 W to 10000 W, preferably for one second to 30 seconds, to oxidize the surface of the third barrier metal layer 140.

Figure 6:
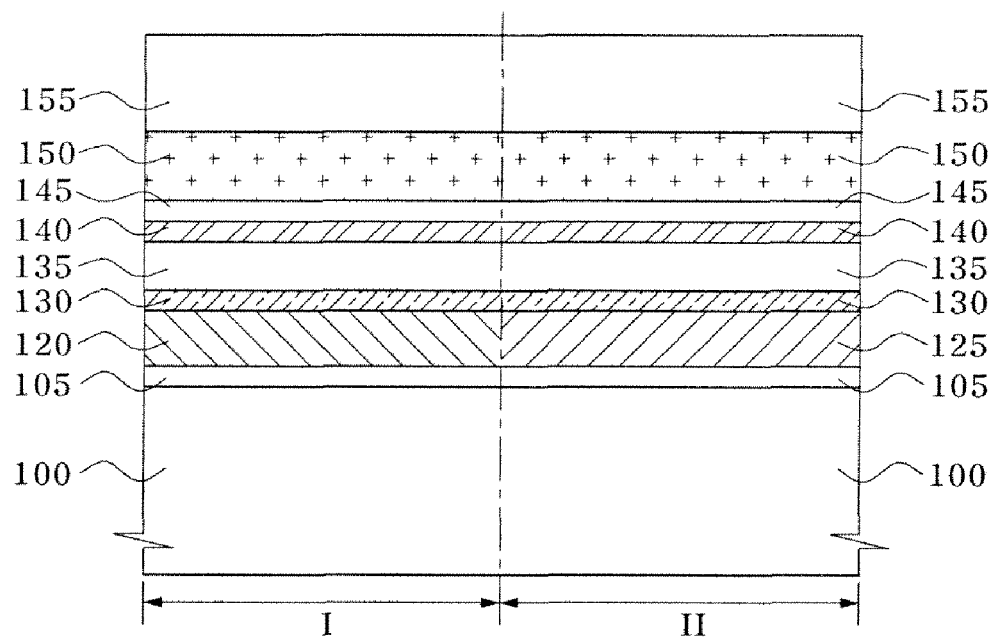

Referring to FIG. 6, a metal layer 150 and a hard mask layer 155 are formed on the oxide layer 145. The metal layer 150 preferably comprises a tungsten (W) layer. It is preferred that this metal layer 150 is formed using physical vapor deposition by supplying a tungsten source material on the semiconductor substrate 100 formed with the oxide layer 145. And, the hard mask layer 155 preferably comprises a nitride layer, and functions as a passivation layer that protects underlying layers in a subsequent etch process for forming a gate stack.

The metal layer 150 is deposited with grain size thereof being increased by the oxide layer 145 formed thereunder. When the oxidation process is implemented, the oxide layer 145 formed on the third barrier metal layer 145 is grown to a nucleation site with small number and small size. As the nucleation site is distributed uniformly in larger number on the third barrier metal layer 145, spacing between the nucleation sites is narrow and thus grains of the metal layer to be formed on the oxide layer are formed uniformly to smaller sizes. In contrast, when the number of the nucleation site is small, the nucleation site is arranged on the third barrier metal layer 145 with a large spacing. Accordingly, the grains of the layer to be subsequently formed are formed large. Since the resistance is in inverse proportion to an area, the larger the grain size is, the smaller the resistance is. Accordingly, the metal layer 150 formed on the oxide layer 145 is deposited in a state that it is formed with the number of the nucleation site reduced and thus the grain size is increased, and thus has a lower resistance with same thin film thickness.

Referring again to FIG. 9, a table showing a roughness, i.e. a grain size, according to a delay time until before deposition of a tungsten layer after deposition of a WSiN layer, a P-v value, i.e. a height difference between peak and valley of the grain measured with an atomic force microscope (AFM) is 5.68 when the tungsten layer is directly deposited on the WSiN layer but P-v value is 8.30 after the delay time of 24 hours has elapsed, showing increase in the grain size. Herein, values not described in the table are sheet resistance uniformity, root of the P-v value, and a full-width-half-maximum value at plane indexes of (1,0,0) and (2,0,0).

Figure 7:
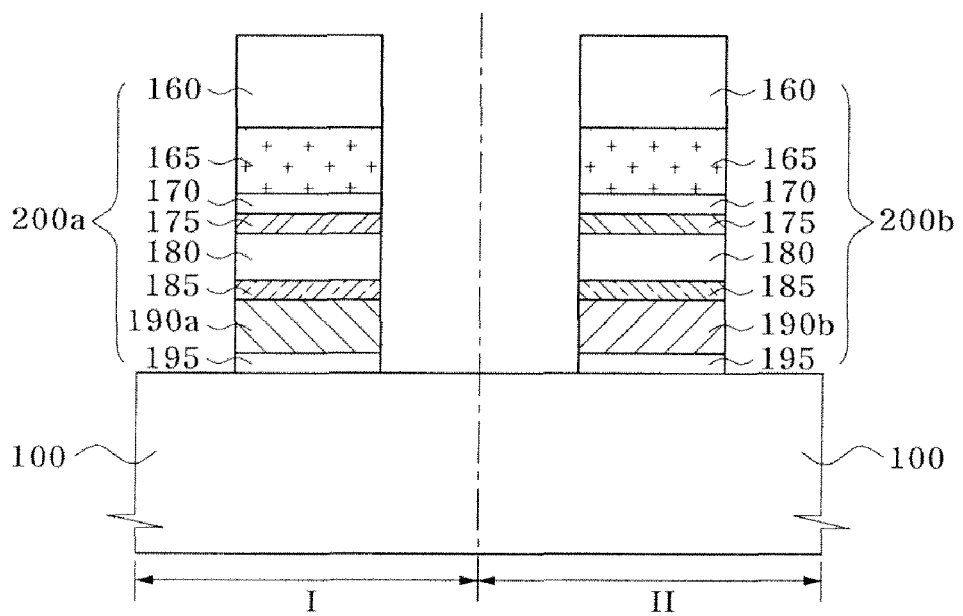
Figure 8:
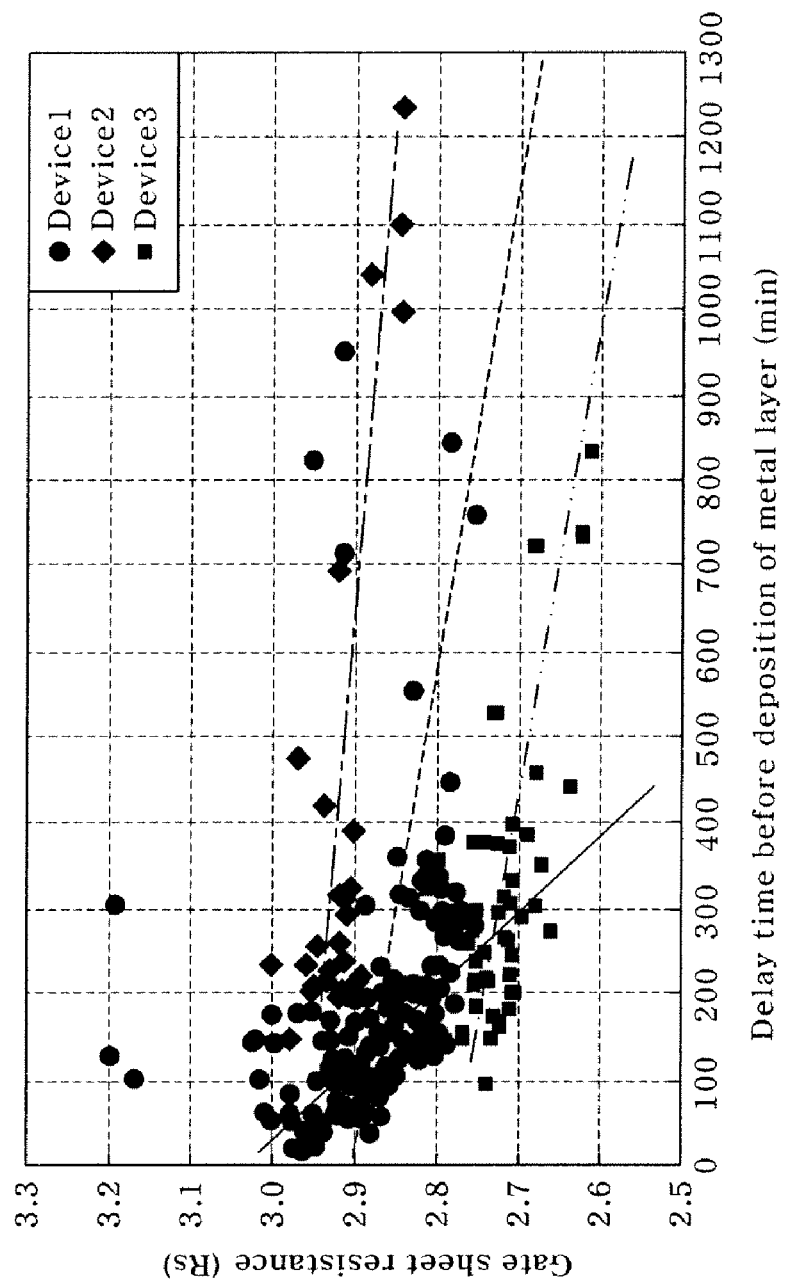
FIG. 8 is a graph illustrating a gate sheet resistance according to a delay time until before deposition of a tungsten layer after deposition of a WSiN layer.

Referring to FIG. 7, an n-type poly gate 200a is formed in the first region (I) of the semiconductor substrate 100 and a p-type poly gate 200b is formed in the second region (II). To this end, a photoresist layer is coated on the hard mask layer 155 (see FIG. 6) and patterned to form a photoresist pattern (not shown) that defines a gate forming region. Subsequently, a process of etching underlying layers is implemented using the photoresist layer as a mask to form the n-type poly gate 200a in the first region (I) of the semiconductor substrate 100 and the p-type poly gate 200b in the second region (II). Herein, the n-type poly gate 200a formed in the first region (I) comprises a gate insulation pattern 195, a first conductive polysilicon pattern 190a, a first barrier metal pattern 185, a second barrier metal pattern 180, a third barrier metal pattern 175, an oxide pattern 170, a metal pattern 185, and a hard mask pattern 160. Also, the p-type poly gate 200b formed in the second region (II) comprises the gate insulation pattern 195, a second conductive polysilicon pattern 190b, the first barrier metal pattern 185, the second barrier metal pattern 180, the third barrier metal pattern 175, the oxide pattern 170, the metal pattern 185, and the hard mask pattern 160.

In accordance with a method for fabricating a dual poly gate in a semiconductor device, an oxide layer is formed on a third barrier metal layer by an oxidation process before forming a metal layer after forming the third barrier metal layer on a semiconductor substrate, a grain size of the metal layer to be formed later is increased, thereby capable of reducing a resistance. Accordingly, it is possible to form a thin film having a lower resistance with the same thickness. Also, the barrier metal layer is stacked in a multi-layered structure and thus diffusion and outflow of the boron ions can be prevented. Accordingly, a resistance of the gate line is reduced to improve a signal transfer speed, thereby capable of improving quality of a product.

While the invention has been described with respect to the specific embodiments, various changes and modifications may be made without departing from the spirit and scope of the invention as defined in the following claims.

What is claimed is:

1. A method for fabricating a dual poly gate in a semiconductor device, comprising:
    forming a gate insulation layer and a polysilicon layer on a semiconductor substrate that defines a first region and a second region;
    implanting first and second conductive type impurity ions into the first region and the second region of the polysilicon layer, respectively;
    forming first and second conductive type polysilicon layers in the first region and the second region, respectively, by annealing the semiconductor substrate;
    forming a barrier metal layer on the first and second conductive type polysilicon layers;
    forming an oxide layer that lowers resistance of metal in the barrier metal layer by an oxidation process;
    forming a metal layer and a hard mask layer on the oxide layer; and
    forming a first conductive type poly gate on the first region and a second conductive type poly gate on the second region by a patterning process.

2. The method of claim 1, wherein the first conductive type impurity is a p-type impurity ion comprising boron (B) ion and the second conductive type impurity is an n-type impurity ion comprising phosphorus (P) ion.

3. The method of claim 1, wherein the barrier metal layer comprises a structure wherein at least one of a titanium (Ti)

layer, a tungsten nitride (WN$_x$) layer, and a tungsten silicon nitride (WSiN) layer is stacked.

4. The method of claim 1, wherein the oxidation process comprises exposing the barrier metal layer to air at atmospheric pressure and ambient temperature for 24 hours to 48 hours to form the oxide layer.

5. The method of claim 1, wherein the oxidation process comprises placing the semiconductor substrate formed with the barrier metal layer within a reactor under an oxygen (O$_2$) atmosphere, and implementing a thermal process that heats the interior of the reactor for 20 seconds to one minute at 400 degrees Celsius to 1000 degrees Celsius.

6. The method of claim 1, wherein the oxidation process comprises placing the semiconductor substrate formed with the barrier metal layer within a plasma chamber, and applying a radio frequency power at 500 W to 10000 W for one second to 30 seconds while injecting an oxygen gas at a flow rate of 50 sccm to 1000 sccm and a mixture gas including a nitrogen (N$_2$) gas or argon (Ar) gas into the plasma chamber and maintaining pressure in the plasma chamber at 1 mTorr to 10 Torr.

7. The method of claim 1, wherein the metal layer comprises a tungsten (W) layer deposited by physical vapor deposition.

8. A method for fabricating a dual poly gate in a semiconductor device, comprising:
    forming a gate insulation layer on a substrate having an n-type region in which an n-type poly gate is disposed and a p-type region in which a p-type poly gate is disposed;
    forming a polysilicon layer doped with n-type impurity ions on the gate insulation layer;
    exposing a portion of the polysilicon layer corresponding to the p-type region;
    doping p-type impurity ions into the exposed portion of the polysilicon layer corresponding to the p-type region;
    forming a barrier metal layer on the polysilicon layer doped with the p-type impurity ions and the polysilicon layer doped with the n-type impurity ions;
    implementing an oxidation process to form an oxide layer on a surface of the barrier metal layer;
    forming a metal layer and a hard mask layer on the oxide layer; and
    forming a first conductive type poly gate on the first region and a second conductive type poly gate on the second region by a patterning process.

9. The method of claim 8, wherein the barrier metal layer comprises a structure wherein at least one of a titanium (Ti) layer, a tungsten nitride (WN$_x$) layer, and a tungsten silicon nitride (WSiN) layer is stacked.

10. The method of claim 8, wherein the barrier metal layer comprises a structure wherein a titanium (Ti) layer, a tungsten nitride (WN$_x$) layer, and a tungsten silicon nitride (WSiN) layer are sequentially stacked.

11. The method of claim 8, wherein the oxidation process comprises exposing the barrier metal layer to air at atmospheric pressure and ambient temperature for 24 hours to 48 hours to form the oxide layer.

12. The method of claim 8, wherein the oxidation process comprises placing the semiconductor substrate formed with the barrier metal layer within a reactor under an oxygen (O$_2$) atmosphere, and implementing a thermal process that heats the interior of the reactor for 20 seconds to one minute at 400 degrees Celsius to 1000 degrees Celsius.

13. The method of claim 8, wherein the oxidation process comprises placing the semiconductor substrate formed with the barrier metal layer within a plasma chamber, and oxidizing the surface of the barrier metal layer by generating oxygen plasma in the plasma chamber.

* * * * *